United States Patent
Sano

(10) Patent No.: US 10,503,195 B2
(45) Date of Patent: Dec. 10, 2019

(54) REFERENCE VOLTAGE GENERATION CIRCUIT

(71) Applicant: ABLIC Inc., Chiba-shi, Chiba (JP)

(72) Inventor: Minoru Sano, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/272,714

(22) Filed: Feb. 11, 2019

(65) Prior Publication Data

US 2019/0294194 A1   Sep. 26, 2019

(30) Foreign Application Priority Data

Mar. 23, 2018   (JP) ................................. 2018/056314

(51) Int. Cl.
*G05F 3/24* (2006.01)
*G01R 19/165* (2006.01)
*G05F 3/26* (2006.01)

(52) U.S. Cl.
CPC ....... *G05F 3/242* (2013.01); *G01R 19/16519* (2013.01); *G05F 3/262* (2013.01)

(58) Field of Classification Search
CPC .... G05F 3/242; G05F 3/262; G01R 16/16519
See application file for complete search history.

(56) References Cited

U.S. PATENT DOCUMENTS

| 7,420,355 | B2 * | 9/2008 | Liu ...................... H02M 3/158 323/271 |
| 7,986,133 | B2 * | 7/2011 | Kudo .................. H02M 3/1584 323/272 |
| 8,058,855 | B2 * | 11/2011 | Cheng ................. H02M 3/1588 323/271 |
| 2004/0212421 | A1 | 10/2004 | Naka et al. |

FOREIGN PATENT DOCUMENTS

JP   2004-280805 A   10/2004

* cited by examiner

*Primary Examiner* — Dinh T Le
(74) *Attorney, Agent, or Firm* — Brinks Gilson & Lione

(57) ABSTRACT

A reference voltage generation circuit small in circuit scale and in power consumption is provided. The reference voltage generation circuit, including a stabilizing capacitor, outputting a voltage at both ends of the stabilizing capacitor as an output voltage, includes a voltage detection circuit, a reference voltage circuit, a stabilizing capacitor, a current source circuit, and a control circuit. The current source circuit generates a first current if the output voltage is lower than a detection voltage and a second current if the output voltage is higher than or equal to the detection voltage, the first current being larger than the second current. The voltage detection circuit includes one of a single transistor and transistors connected by cascode connection that is smaller in the number of stages than the cascode connection in the reference voltage circuit.

2 Claims, 5 Drawing Sheets

Prior Art

REFERENCE VOLTAGE GENERATION CIRCUIT

RELATED APPLICATIONS

This application claims priority under 35 U.S.C. § 119 to Japanese Patent Application No. 2018-056314 filed on Mar. 23, 2018, the entire content of which is hereby incorporated by reference.

BACKGROUND OF THE INVENTION

1. Field of the Invention

The present invention relates to a reference voltage generation circuit.

2. Description of the Related Art

Electronic devices to be worn on person, typically, wearable devices, are each small in size, and the capacity of a battery installed in the devices accordingly tends to be small. Since the electronic devices to be worn on person have the battery of which the capacity is small in many cases, an electronic circuit to be installed in the electronic devices to be worn on person is demanded to be small in size and low in current consumption.

A way to run an electronic circuit to be installed in the electronic devices to be worn on person on low current consumption is to save power by putting the electronic circuit in a normal operation state only when the electronic circuit is in use, and putting the electronic circuit in a non-operation state while not in use. For further power saving, the normal operation state and the non-operation state may be switched quickly when the electronic circuit is in use as well. That is, the electronic circuit may intermittently operate, thereby saving the power in the normal operation state.

Further, it is common to add a stabilizing capacitor to a reference voltage generation circuit in an electronic circuit running on low current consumption, in order to stabilize output against anticipated disturbance from external noise.

However, the stabilizing capacitor is charged with a small amount of current if a reference voltage generation circuit running intermittently shifts from the non-operation state to the normal operation state, and the output of the reference voltage generation circuit consequently takes time to reach stability. In consideration of this circumstance, a circuit for rapidly charging the stabilizing capacitor is being investigated.

FIG. 7 illustrates a reference voltage generation circuit 1 of the related art (Japanese Patent Application Laid-open No. 2004-280805). The reference voltage generation circuit 1 includes a reference voltage circuit 2, a stabilizing capacitor 3, a rapid reference voltage stabilizer 4, a shut-down circuit 5, a sub-reference voltage circuit 6, and a comparator 7. The reference voltage generation circuit 1 has a function of rapidly charging the stabilizing capacitor in a shift from the non-operation state to the normal operation state and of automatically stopping the rapid charge operation when a stable voltage is reached.

However, a drawback is that a conventional reference voltage generation circuit such as the reference voltage generation circuit 1 requires a comparator for comparison between the reference voltage circuit and the sub-reference voltage circuit. A high-speed operation comparator is required in order to accomplish quick activation of the reference voltage generation circuit, and thereby invites an increase in the circuit scale of the comparator and an increase in current consumption.

SUMMARY OF THE INVENTION

It is therefore an object of the present invention to provide a reference voltage generation circuit small in circuit scale and in power consumption.

According to one embodiment of the present invention, there is provided a reference voltage generation circuit, including a stabilizing capacitor, outputting a voltage at both ends of the stabilizing capacitor as an output voltage, includes: a reference voltage circuit including transistors connected by cascode connection, being configured to set a voltage at both ends of the charged stabilizing capacitor to the reference voltage; a voltage detection circuit configured to have a detection voltage lower than the reference voltage; and a current source circuit configured to generate a current with which the stabilizing capacitor is charged and to vary the current generated in accordance with a detection by the voltage detection circuit; a control circuit configured to switch the reference voltage circuit between a non-operation state and an operation state, the current source circuit being configured to generate a first current if the output voltage is lower than the detection voltage and a second current if the output voltage is higher than or equal to the detection voltage, the first current being larger than the second current, the voltage detection circuit including one of a single transistor and transistors connected by cascode connection that has a number of stages smaller than the number of cascode connection stages in the reference voltage circuit.

The reference voltage generation circuit according to one embodiment of the present invention is capable of high-speed intermittent operation, and consequently enables a small-sized electronic device to run on low current consumption.

DETAILED DESCRIPTION OF THE PREFERRED EMBODIMENTS

First Embodiment

Figure 1:
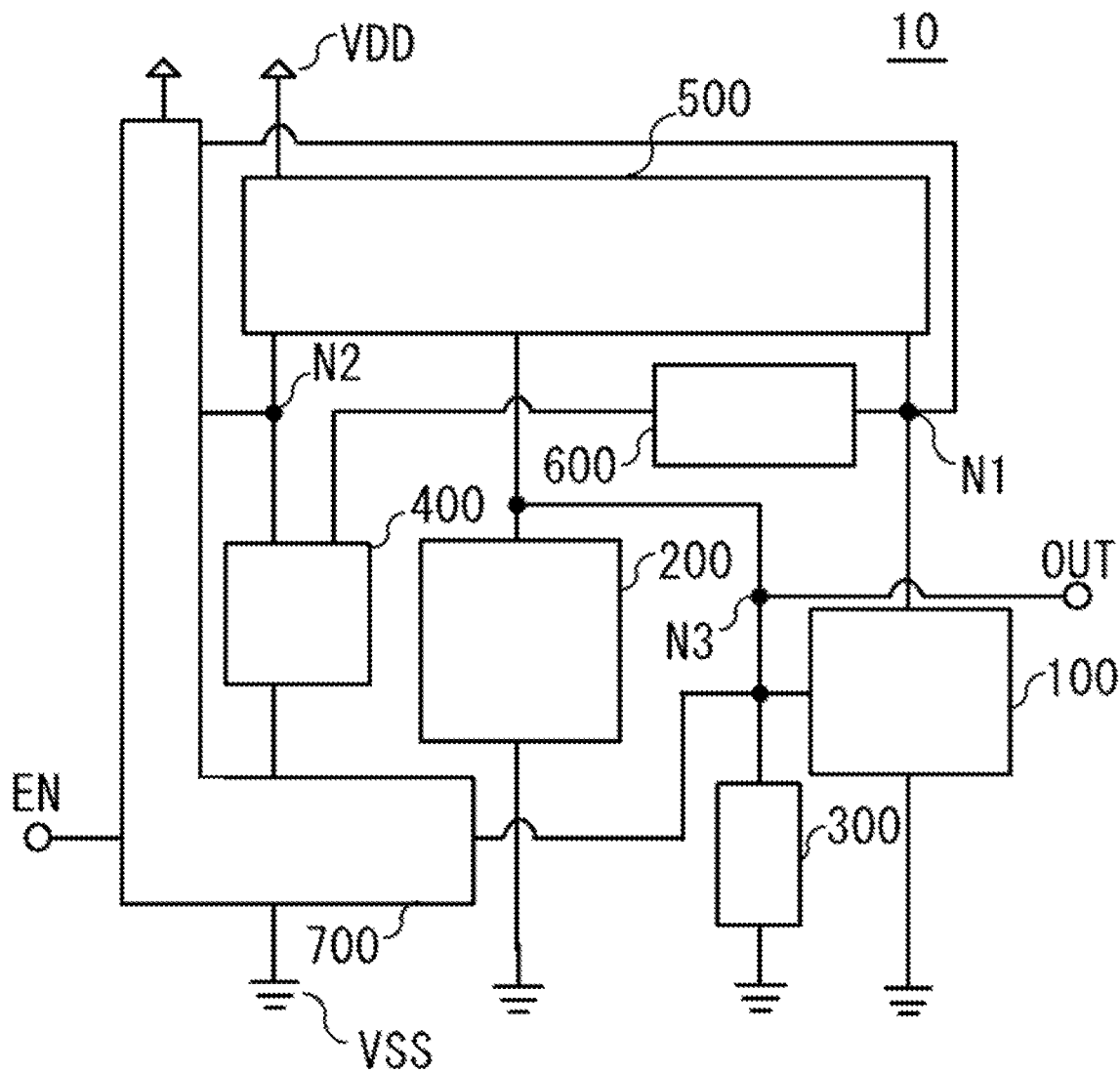
FIG. 1 is a block diagram for illustrating the configuration of a reference voltage generation circuit according to a first embodiment of the present invention.

FIG. 1 is a block diagram for illustrating the configuration of a reference voltage generation circuit 10 according to a first embodiment of the present invention. The reference voltage generation circuit 10 includes an input terminal EN, an output terminal OUT, a voltage detection circuit 100, a reference voltage circuit 200, a stabilizing capacitor 300, a current source circuit 400, a current mirror circuit 500, a latch circuit 600, and a control circuit 700. The reference voltage generation circuit 10 switches between a non-operation state and a normal operation state if a control signal enters to the input terminal EN.

The input terminal EN is connected to the control circuit 700. The control circuit 700 is connected via a node N1 to the voltage detection circuit 100, the current mirror circuit 500, and the latch circuit 600, connected via a node N2 to the current source circuit 400 and the current mirror circuit 500, and connected via a node N3 to the output terminal OUT, the voltage detection circuit 100, the reference voltage circuit 200, the stabilizing capacitor 300, and the current mirror circuit 500. Further, the control circuit 700 is connected by another wire to the current source circuit 400. The current source circuit 400 is connected to the latch circuit 600.

Details of the configuration of the reference voltage generation circuit 10 are described with reference to FIG. 2.

The voltage detection circuit 100 includes an enhancement NMOS transistor 11. The NMOS transistor 11 has a drain connected to an input of an inverter 61 via the node N1, a source connected to a terminal VSS serving as a second power supply terminal, and a gate connected to one of terminals of the stabilizing capacitor 300 and to the output terminal OUT via the node N3.

The reference voltage circuit 200 includes enhancement NMOS transistors 21 and 22. The NMOS transistor 22 has a drain and a gate respectively connected to the node N3, and a source connected to a drain of the NMOS transistor 21. The NMOS transistor 21 has a gate connected to the node N3, and a source connected to the terminal VSS. The other terminal of the stabilizing capacitor 300 is connected to the terminal VSS.

The current source circuit 400 includes depletion NMOS transistors 41 and 42 and an enhancement NMOS transistor 43. The depletion NMOS transistor 41 has a drain connected to a drain of a PMOS transistor 51 via the node N2, a gate connected to the terminal VSS, and a source connected to a drain of the depletion NMOS transistor 42 and to a drain of the NMOS transistor 43. The depletion NMOS transistor 42 has a gate connected to the terminal VSS, and a source connected to a drain of an NMOS transistor 72 and to a source of the NMOS transistor 43. The NMOS transistor 43 has a gate connected to an output of an inverter 62.

The current mirror circuit 500 includes enhancement PMOS transistors 51, 52, and 53. The PMOS transistor 51 has a source connected to a terminal VDD serving as a first power supply terminal, and a gate and the drain, which are connected to the node N2. The PMOS transistor 52 has a source connected to the terminal VDD, a gate connected to the node N2, and a drain connected to the node N3. The PMOS transistor 53 has a source connected to the terminal VDD, a gate connected to the node N2, and a drain connected to the node N1.

The latch circuit 600 includes the inverters 61 and 62 and an enhancement NMOS transistor 63. The input of the inverter 61 is connected to the node N1 and a drain of the NMOS transistor 63. An output of the inverter 61 is connected to an input of the inverter 62 and a gate of the NMOS transistor 63. The output of the inverter 62 is connected to the gate of the NMOS transistor 43. A source of the NMOS transistor 63 is connected to the terminal VSS.

The control circuit 700 includes an inverter 71, the enhancement NMOS transistor 72, an enhancement NMOS transistor 73, and enhancement PMOS transistors 74 and 75. An input of the inverter 71 is connected to the input terminal EN, a gate of the NMOS transistor 72, and gates of the PMOS transistors 74 and 75. An output of the inverter 71 is connected to a gate of the NMOS transistor 73. The NMOS transistor 73 has a drain connected to the node N3 and a source connected to the terminal VSS. The NMOS transistor 72 has the gate connected to the input terminal EN, the drain connected to the source of the depletion NMOS transistor 42 and to the source of the NMOS transistor 43, and a source connected to the terminal VSS. The PMOS transistor 74 has the gate connected to the input terminal EN, a drain connected to the node N2, and a source connected to the terminal VDD. The PMOS transistor 75 has the gate connected to the input terminal EN, a drain connected to the node N1, and a source connected to the terminal VDD.

Figure 3:
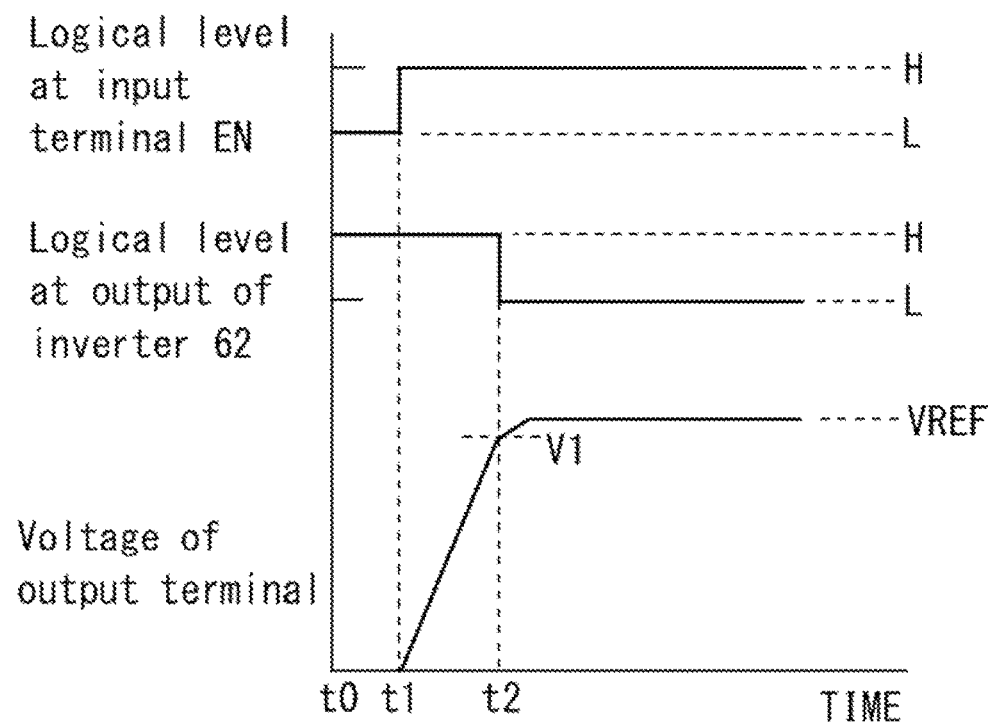
FIG. 3 is a timing chart for illustrating the operation of the reference voltage generation circuit according to the first embodiment.

Next, the operation of the reference voltage generation circuit 10 is described with reference to FIG. 3. In FIG. 3, the axis of abscissa represents time, the axis of ordinate represents the voltage of the output terminal OUT, and logical levels at the input terminal EN and the output of the inverter 62 are illustrated. At a time t0, a signal at a level L is input to the input terminal EN, and the reference voltage generation circuit 10 is in a non-operation state. Specifically, a voltage at a level H is input to the gate of the NMOS transistor 73 via the inverter 71 to turn on the NMOS transistor 73 and set the electric potential of the output terminal OUT to the voltage level of the terminal VSS. The NMOS transistor 72 is turned off by an input of a level-L voltage to its gate, and the PMOS transistor 74 is turned on by an input of a Level-L voltage to its gate. As a result of turning off the NMOS transistor 72 and turning on the PMOS transistor 74, there is no current flow in the current source circuit 400. The PMOS transistor 75 is turned on by an input of the Level-L voltage to its gate to set an input of the latch circuit 600 to the level H. A voltage at the level H is input to the gate of the NMOS transistor 43 from the output of the inverter 62 in the latch circuit 600 to turn on the NMOS transistor 43 and causes a short circuit between the drain and source of the depletion NMOS transistor 42 in the current source circuit 400.

Next, at a time t1, an input of an H-level voltage to the input terminal EN puts the reference voltage generation circuit 10 into a normal operation state. The NMOS transistor 73 keeps the electric potential of the output terminal OUT at the voltage level of the terminal VSS until receiving an L-level voltage from its gate via the inverter 71. The NMOS transistor 73 is turned off by an input of the L-level voltage, thereby separating the electric potential of the output terminal OUT from the voltage level of the terminal VSS. The NMOS transistor 72 is turned on by an input of an H-level voltage to its gate, and the PMOS transistor 74 is turned off by an input of an H-level voltage to its gate. As a result of turning on the NMOS transistor 72 and turning off the PMOS transistor 74, there is a current flow in the current source circuit 400. A current based on the current source circuit 400 is supplied to the reference voltage circuit 200 and the stabilizing capacitor 300 via the current mirror circuit 500 to start the charging of the stabilizing capacitor 300 and a rise in the voltage of the output terminal OUT. Here, the latch circuit 600 retains the result obtained if the input terminal EN is at the level L, and accordingly maintains the output of the inverter 62 which is still at the level H. The NMOS transistor 43 causes a short circuit between the drain and source of the depletion NMOS transistor 42 due to the output of the inverter 62 which is at the level H, and the current source circuit 400 thus runs on the depletion NMOS transistor 41 alone. There are a first state where the current source circuit 400 runs on the depletion NMOS transistor 41 alone and a second state where the current source circuit 400 runs on a cascode connection circuit made up of the depletion NMOS transistors 41 and 42. In comparison a first current flowed in the current source circuit 400 which is in the first state with a second current flowed in the current source circuit 400 which is in the second state, the first current is larger than the second current. As a result of increasing the current flow in the current source circuit 400, the stabilizing capacitor 300 is charged rapidly, and the voltage of the output terminal OUT rises accordingly rapidly.

At a time t2, the voltage of the output terminal OUT reaches a threshold voltage V1 of the voltage detection circuit 100 or higher. The voltage detection circuit 100 then inverts the output to invert the output of the inverter 62 of the latch circuit 600 to the level L and turn off the NMOS transistor 43. As a result of turning off the NMOS transistor 43, the current source circuit 400 runs on the cascode connection circuit made up of the depletion NMOS transistors 41 and 42, and the current flowing in the current source circuit 400, i.e., the second current is accordingly reduced. Since the current with which the stabilizing capacitor 300 is charged through the current mirror circuit 500 is reduced, the voltage of the output terminal OUT gradually rises. When the voltage of the output terminal OUT reaches an output voltage VREF set by the reference voltage circuit 200, the NMOS transistors 21 and 22 included in the reference voltage circuit 200 are turned on, and the output terminal OUT outputs the output voltage VREF set by the reference voltage circuit 200.

The voltage detection circuit 100 is configured by the NMOS transistor 11 alone, and there is accordingly no back gate effect on the threshold voltage of the NMOS transistor 11. The NMOS transistors 21 and 22 included in the reference voltage circuit 200 make up the cascode connection circuit, and there is accordingly a back gate effect on the threshold voltage of the NMOS transistors 21 and 22. This means that a detection voltage detected by the voltage detection circuit 100 is lower than the output voltage VREF of the reference voltage circuit 200 as illustrated in the timing chart of FIG. 3, and allows the voltage detection circuit 100 to detect the rise of the voltage of the output terminal OUT to a point near the output voltage VREF.

The voltage detection circuit 100 is a source-grounded circuit configured by the NMOS transistor 11, and accordingly speeds up the operation of detecting a reference voltage by increasing a bias current supplied from the current mirror circuit 500 until the reference voltage is detected.

The voltage detection circuit 100 is configured by transistor 11 which has the same characteristics as transistors 21 and 22 included in the reference voltage circuit 200 in the first embodiment. However, the voltage detection circuit and the reference voltage circuit may be configured by a combination of transistors having different characteristics by using a transistor that has a low threshold for the voltage detection circuit and transistors that have a high threshold for the reference voltage circuit.

The NMOS transistors and the PMOS transistors may be switched with each other to obtain a reference voltage generation circuit reverse in positive/negative polarity to the reference voltage generation circuit 10.

Second Embodiment

Figure 4:
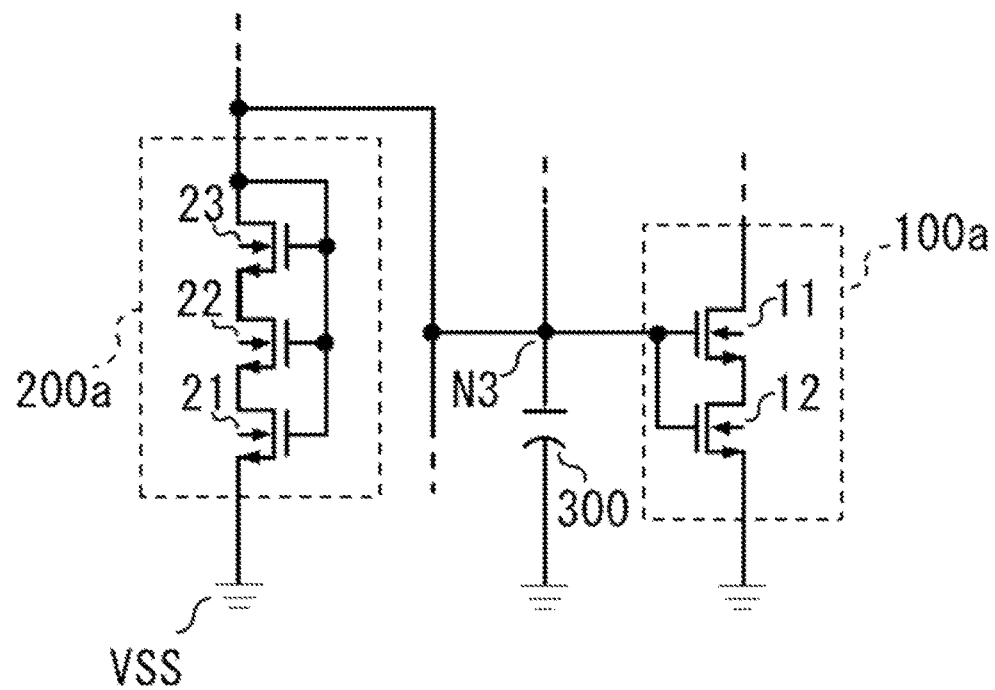
FIG. 4 is a circuit diagram for illustrating the configuration of a main part of a reference voltage generation circuit according to a second embodiment of the present invention.

FIG. 4 illustrates a reference voltage circuit 200*a* and voltage detection circuit 100*a* in a reference voltage generation circuit (which will be hereinafter referred to as "second reference voltage generation circuit") according to the second embodiment of the present invention. The second reference voltage generation circuit has the same components as in the reference voltage generation circuit 10 (illustrated in FIG. 2) except the voltage detection circuit 100 (illustrated in FIG. 2) and the reference voltage circuit 200 (illustrated in FIG. 2). The reference voltage circuit 200*a* is obtained by replacing the transistors of the reference voltage circuit 200 with a three-stage cascode connection circuit that is made up of the enhancement NMOS transistors 21 and 22 and an enhancement NMOS transistor 23, and the voltage detection circuit 100*a* is obtained by replacing the transistor of the voltage detection circuit 100 (illustrated in FIG. 2) with a two-stage cascode connection circuit that is made up of the enhancement NMOS transistor 11 and an enhancement NMOS transistor 12.

The NMOS transistor 23 has a drain and a gate respectively connected to the node N3, and a source connected to the drain of the NMOS transistor 22. The gate of the NMOS transistor 22 is connected to the node N3, and the source of the NMOS transistor 22 is connected to the drain of the NMOS transistor 21. The gate of the NMOS transistor 21 is connected to the node N3, and the source of the NMOS transistor 21 is connected to the terminal VSS.

Figure 2:
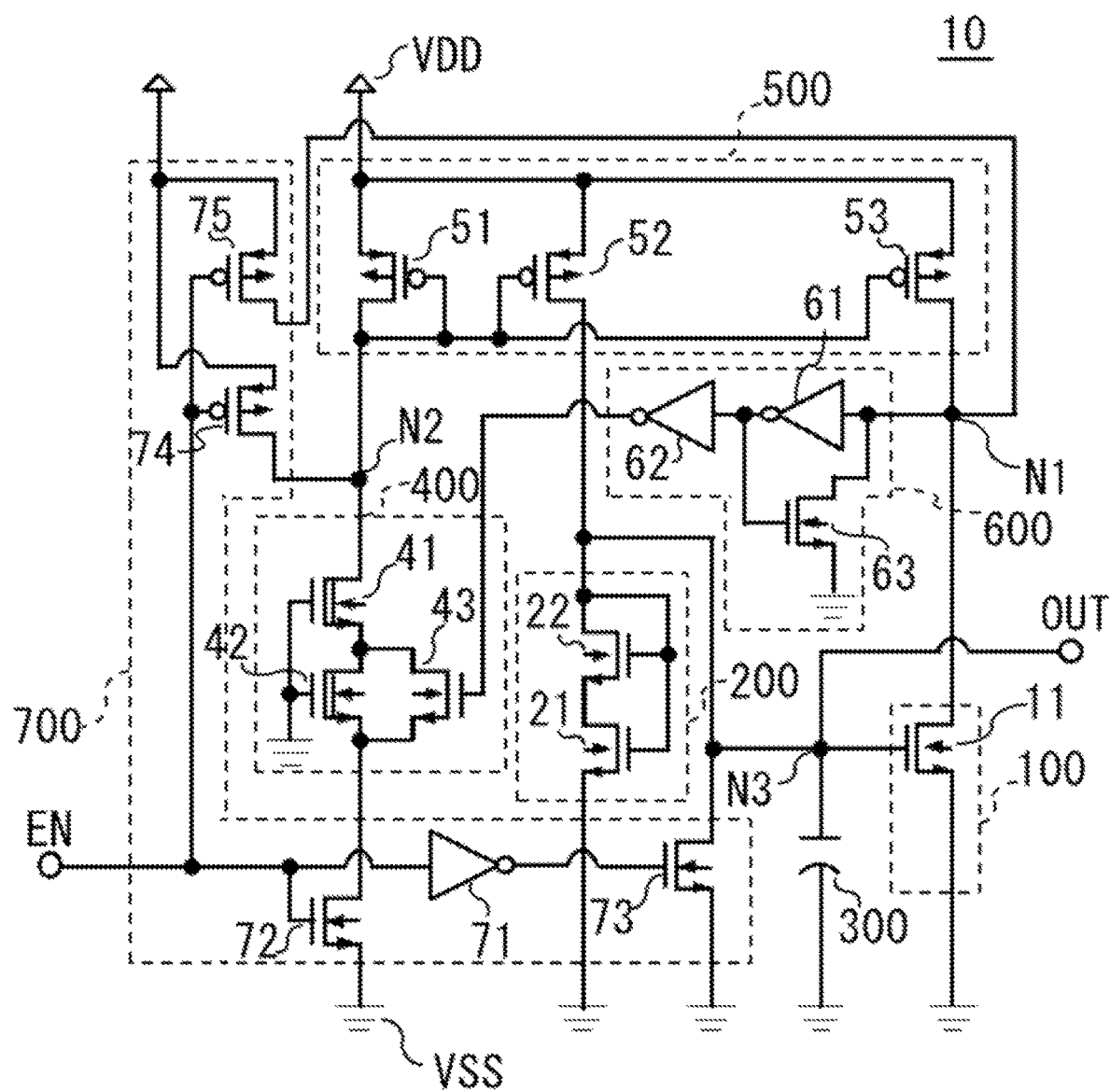
FIG. 2 is a circuit diagram for illustrating the configuration of the reference voltage generation circuit according to the first embodiment.

The drain of the NMOS transistor 11 is connected to the input of the inverter 61 (illustrated in FIG. 2) via the node N1 (illustrated in FIG. 2). The source of the NMOS transistor 11 is connected to a drain of the NMOS transistor 12. The gate of the NMOS transistor 11 is connected to one of the terminals of the stabilizing capacitor 300 and to the output terminal OUT (illustrated in FIG. 2) via the node N3. The NMOS transistor 12 has a source connected to the terminal VSS, and a gate connected to the one of the terminals of the stabilizing capacitor 300 and to the output terminal OUT via the node N3.

The voltage detection circuit can conduct voltage detection at a voltage lower than a reference voltage generated by the reference voltage circuit, if the number of stages of the cascode connection in the voltage detection circuit is smaller than the number of stages of the cascode connection in the reference voltage circuit. The operation of a reference voltage generation circuit according to the second embodiment is the same contents as the operation of the reference voltage circuit according to the first embodiment, and a description on the operation is therefore omitted.

Third Embodiment

Figure 5:
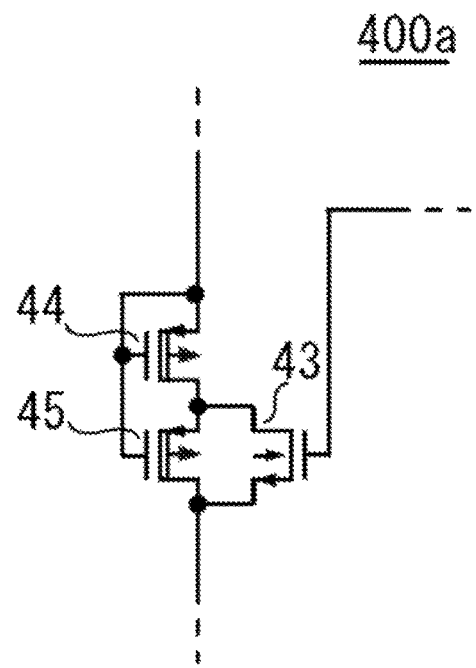
FIG. 5 is a circuit diagram for illustrating the configuration of a main part of a reference voltage generation circuit according to a third embodiment of the present invention.

FIG. 5 illustrates a current source circuit 400*a* in a reference voltage generation circuit (which will be hereinafter referred to as "third reference voltage generation circuit") according to the third embodiment of the present invention. The third reference voltage generation circuit has the same components as in the reference voltage generation circuit 10 (illustrated in FIG. 2) except the voltage detection circuit 400 (illustrated in FIG. 2). The current source circuit 400*a* is obtained by replacing the depletion NMOS transistors 41 and 42 of the current source circuit 400 in the reference voltage generation circuit 10 with depletion PMOS transistors 44 and 45, and connecting gates of the PMOS transistors 44 and 45 to the node N2 (illustrated in FIG. 2). The operation of the reference voltage generation circuit is the same as the operation of the reference voltage circuit 10, and a description on the operation is therefore omitted.

Fourth Embodiment

Figure 6:
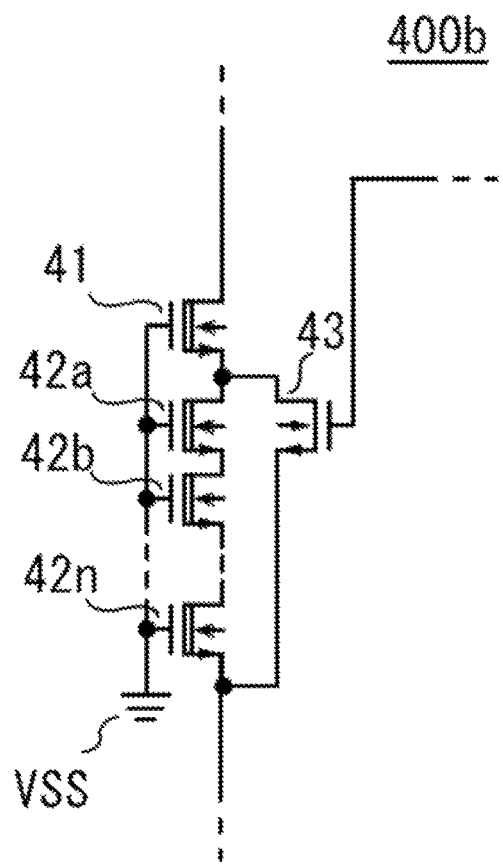
FIG. 6 is a circuit diagram for illustrating the configuration of a main part of a reference voltage generation circuit according to a fourth embodiment of the present invention.
Figure 7:
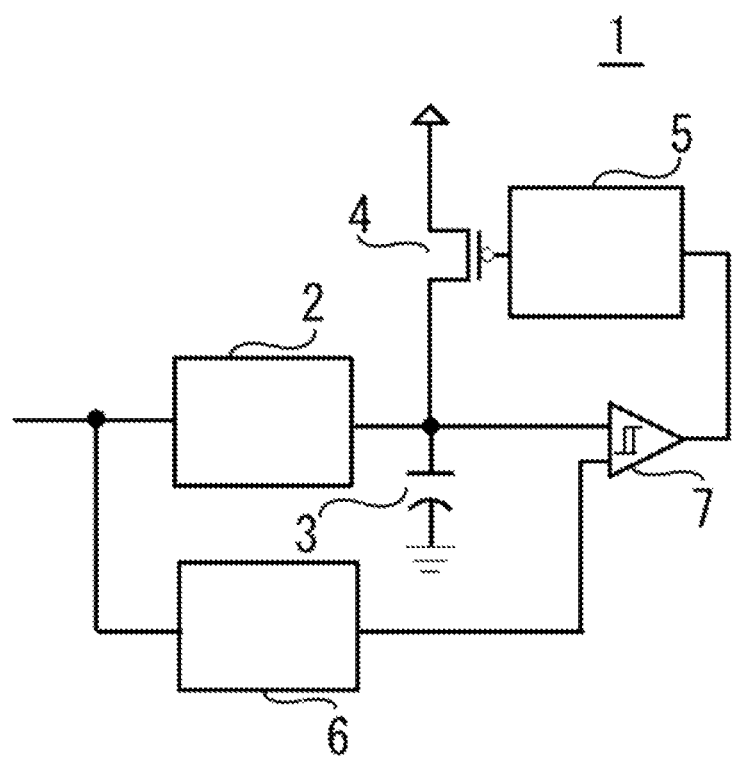
FIG. 7 is a diagram for illustrating the configuration of a reference voltage generation circuit of the related art.

FIG. 6 illustrates a current source circuit 400*b* in a reference voltage generation circuit (which will be hereinafter referred to as "fourth reference voltage generation circuit") according to the fourth embodiment of the present invention. The fourth reference voltage generation circuit has the same components as in the reference voltage generation circuit 10 (illustrated in FIG. 2) except the voltage detection circuit 400 (illustrated in FIG. 2). The current source circuit 400b is obtained by replacing the depletion NMOS transistors 41 and 42 of the current source circuit 400 in the first embodiment with the depletion NMOS transistor 41 and depletion NMOS transistors 42a, 42b . . . and 42n, and setting the number of stages of cascade connection in which a short circuit is to be caused to two or more.

The drain of the depletion NMOS transistor 41 is connected to the drain of the PMOS transistor 51 via the node N2. The gate of the NMOS transistor 41 is connected to the terminal VSS. The source of the NMOS transistor 41 is connected to a drain of the depletion NMOS transistor 42a and to the drain of the NMOS transistor 43. The depletion NMOS transistor 42a has a gate connected to the terminal VSS, and a source connected to a drain of the depletion NMOS transistor 42b. The depletion NMOS transistor 42b has a gate connected to the terminal VSS, and a source connected to a drain of the depletion NMOS transistor next to the depletion NMOS transistor 42b, serving as a following stage. In this manner, the following depletion NMOS transistors each have a gate connected to the terminal VSS, and a source connected to a drain of the depletion NMOS transistor next to the following depletion NMOS transistor. The depletion NMOS transistor 42n serving as a final stage of the cascode connection has a gate connected to the terminal VSS, and a source connected to the drain of the NMOS transistor 72 and to the source of the NMOS transistor 43.

The operation of the fourth reference voltage generation circuit is the same contents as the operation of the reference voltage circuit 10, and a description on the operation is therefore omitted. The fourth reference voltage generation circuit is capable of reducing the current consumption in the normal operation state after the rapid charging of the stabilizing capacitor 300 even more than the reference voltage generation circuit 10 including the current source circuit 400. That is, the fourth reference voltage generation circuit includes the current source circuit 400b containing the cascode connection circuit of which the number of stages is three or more, and accordingly reduces the current consumption in the normal operation state after the rapid charging of the stabilizing capacitor 300 in comparison with the reference voltage generation circuit 10 including the current source circuit 400 of which the number of stages of cascode connection is two.

What is claimed is:

1. A reference voltage generation circuit, including a stabilizing capacitor, outputting a voltage at both ends of the stabilizing capacitor as an output voltage, comprising:
   a reference voltage circuit including transistors connected by cascode connection, being configured to set a voltage at both ends of the charged stabilizing capacitor to the reference voltage;
   a voltage detection circuit configured to detect the output voltage relative to a detection voltage, the detection voltage being lower than the reference voltage; and
   a current source circuit connected to the voltage detection circuit and configured to generate a current with which the stabilizing capacitor is charged and to vary the current generated in accordance with a detection by the voltage detection circuit;
   a control circuit configured to switch the reference voltage circuit between a non-operation state and an operation state,
     the current source circuit being configured to generate a first current if the output voltage is lower than the detection voltage as detected by the voltage detection circuit and a second current if the output voltage is higher than or equal to the detection voltage as detected by the voltage detection circuit, the first current being larger than the second current,
     the voltage detection circuit including one of a single transistor and transistors connected by cascode connection that has a number of stages smaller than the number of cascode connection stages in the reference voltage circuit.

2. The reference voltage generation circuit according to claim 1, wherein the current source circuit includes depletion transistors connected by cascode connection, and a short circuit is caused by an output from the voltage detection circuit between a source and a drain in at least one of the depletion transistors connected by cascode connection.

* * * * *